(12) United States Patent
Bayerer (10) Patent No.: US 9,661,751 B2
(45) Date of Patent: May 23, 2017

(54) POWER SEMICONDUCTOR MODULE ARRANGEMENT

(71) Applicant: Infineon Technologies AG, Neubiberg (DE)

(72) Inventor: Reinhold Bayerer, Reichelsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/005,345

(22) Filed: Jan. 25, 2016

(65) Prior Publication Data

US 2016/0219705 A1 Jul. 28, 2016

(30) Foreign Application Priority Data

Jan. 26, 2015 (DE) .................. 10 2015 101 086

(51) Int. Cl.
| | |
|---|---|
| *H05K 1/14* | (2006.01) |
| *H01L 25/16* | (2006.01) |
| *H05K 1/02* | (2006.01) |
| *H05K 1/18* | (2006.01) |

(52) U.S. Cl.
CPC .......... *H05K 1/142* (2013.01); *H01L 25/162* (2013.01); *H05K 1/0262* (2013.01); *H05K 1/145* (2013.01); *H05K 1/181* (2013.01); *H01L 2924/0002* (2013.01); *H05K 1/144* (2013.01); *H05K 2201/04* (2013.01); *H05K 2201/1059* (2013.01); *H05K 2201/10166* (2013.01); *H05K 2201/10303* (2013.01); *H05K 2201/10318* (2013.01)

(58) Field of Classification Search
CPC ...... H05K 1/142; H05K 1/0262; H05K 1/145; H05K 1/181; H01L 25/162
See application file for complete search history.

(56) References Cited

U.S. PATENT DOCUMENTS

| | | | |
|---|---|---|---|
| 8,981,553 B2 * | 3/2015 | Schwarzer | H01L 23/5226 257/686 |
| 2016/0360588 A1 * | 12/2016 | Hulshof | H05B 33/0821 |

* cited by examiner

*Primary Examiner* — Long Pham
(74) *Attorney, Agent, or Firm* — Murphy, Bilak & Homiller, PLLC

(57) ABSTRACT

A power semiconductor module arrangement includes a semiconductor module having a controllable power semiconductor component, a first printed circuit board (PCB) arranged outside the semiconductor module, and a control unit arranged outside the semiconductor module and having a second PCB. The control unit is configured to control the controllable power semiconductor component. The controllable power semiconductor component has a first load terminal and a second load terminal between which a load path of the power semiconductor component is formed, and also a control terminal for controlling the load path. The first PCB has a conductor track connected in series with the load path. The first and second PCBs are spaced apart from one another and electrically connected to one another by a pin.

17 Claims, 6 Drawing Sheets

POWER SEMICONDUCTOR MODULE ARRANGEMENT

PRIORITY CLAIM

This application claims priority to German Patent Application No. 10 2015 101 086.0 filed on 26 Jan. 2015, the content of said application incorporated herein by reference in its entirety.

TECHNICAL FIELD

The present invention relates to a power semiconductor module arrangement having a power semiconductor module and one or a plurality of other assemblies.

BACKGROUND

Power semiconductor modules contain one or a plurality of power semiconductors. The maximum permissible junction temperatures of such power semiconductors are typically above 125° C. or 150° C. Recent developments give reason to expect 175° C. and even 200° C. Therefore, it is advantageous if circuit parts of a power electronic circuit which are designed only for a low thermal loading (e.g. a permissible maximum temperature of 125° C. or 85° C.), or whose lifetime is significantly shortened at high temperatures are protected against excessive heating by the power semiconductors. Examples of such thermally sensitive circuit parts are capacitors which stabilize the DC voltage supply of the power electronics and/or serve as charge stores (e.g. intermediate circuit capacitors), or drive circuits that drive the power semiconductors.

Drive circuits are often intended also to measure, and if necessary to limit and/or to regulate, the edge steepness of a current flowing through a power semiconductor and/or the edge steepness of a voltage dropped across a power semiconductor. For this purpose, the drive circuit requires electrically connections to the power semiconductors. In this case, it must be ensured that the signals measured by means of said electrical connections have suitable signal levels, such that they can be evaluated by the drive circuit without a high outlay. A further requirement is for the conductors through which a load current of the power semiconductor flows to be of low inductance.

SUMMARY

Embodiments described herein relate to a power semiconductor arrangement in which one or a plurality of power semiconductors is/are thermally decoupled from one or a plurality of thermally sensitive components, in which suitable signal levels from the one or the plurality of power semiconductors are fed to a drive circuit in a simple manner, and in which the load circuit is of low-inductance design.

One aspect of the invention relates to a power semiconductor arrangement. The latter comprises a semiconductor module having a controllable power semiconductor component. The power semiconductor component has a first load terminal and a second load terminal, a load path formed between the first load terminal and the second load terminal, and a control terminal for controlling the load path. Outside the semiconductor module there is a first printed circuit board having a conductor track connected in series with the load path. Also arranged outside the semiconductor module is a control unit configured to control the controllable power semiconductor component. The control unit comprises a second printed circuit board. The first printed circuit board and the second printed circuit board are spaced apart from one another. Moreover, the first printed circuit board and the second printed circuit board are electrically connected to one another by at least one pin.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of the description. The drawings illustrate examples and together with the description serve to explain principles of embodiments. Other embodiments and many of the intended advantages of embodiments will be readily appreciated as they become better understood by reference to the following detailed description.

DETAILED DESCRIPTION

Figure 1:
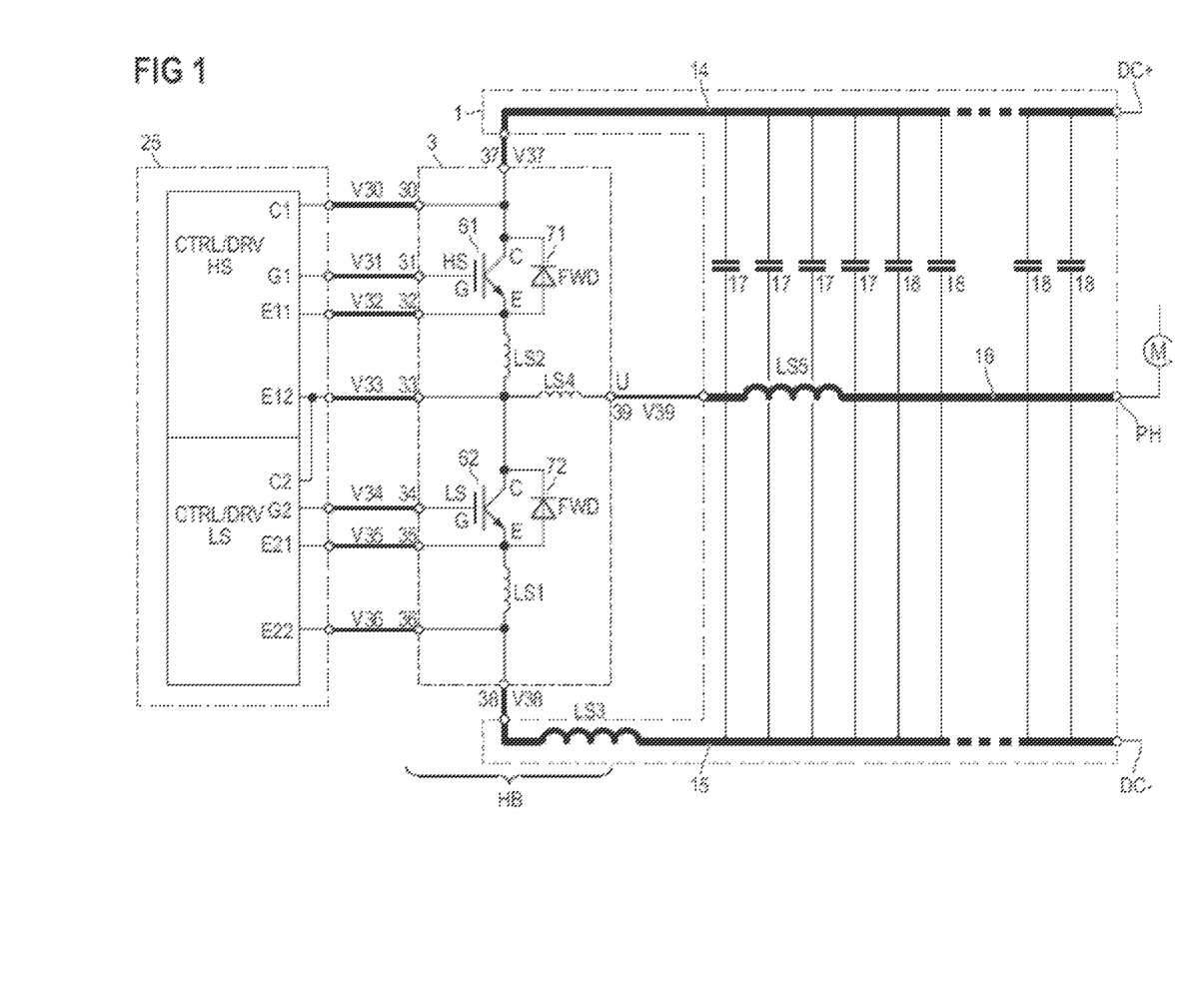
FIG. 1 shows a circuit diagram of one configuration of a power semiconductor arrangement.

FIG. 1 shows a circuit diagram of a power semiconductor arrangement. The latter comprises a semiconductor module 3, and also a first printed circuit board 1 populated with temperature-sensitive components 17, 18. The temperature-sensitive components 17, 18 are embodied as capacitors 17, 18 by way of example.

The semiconductor module 3 comprises a half-bridge HB having two controllable semiconductor switches 61 (HS="High Side") and 62 (LS="Low Side"). The first semiconductor switch 61 comprises a first load terminal (here: collector C), and a second load terminal (here: emitter E), and also a control terminal (here: gate G), by means of which an electric current through a load path (here: the path C-E) of the first semiconductor switch 61 can be controlled.

Correspondingly, the second semiconductor switch 62 comprises a first load terminal (here: collector C) and a second load terminal (here: emitter E), and also a control terminal (here: gate G), by means of which an electric current through a load path (here: the path C-E) of the second semiconductor switch 62 can be controlled. The second load terminal (here: C) of the first semiconductor switch 61 is electrically connected to the first load terminal (here: E) of the second semiconductor switch 62. Optionally, a respective freewheeling diode FWD can be connected (anti)parallel with the load paths (C-E) of each of the semiconductor switches 61, 62.

Even though n-channel IGBTs are shown as semiconductor switches 61, 62 in the present example, any other bipolar or unipolar semiconductor switches 61, 62 can be used instead, for example MOSFETs (Metal Oxide Semiconductor Field Effect Transistor), JFETs (Junction Field Effect Transistor), HEMTs (High Electron Mobility Transistor), thyristors, etc. Depending on the component, the first and second load terminals of a component can also be collector and emitter, or drain and source, or source and drain.

By means of suitable driving of the controllable semiconductor switches 61, 62, a desired voltage profile can be set at a circuit node between the load paths (C-E) of the two semiconductor switches 61 and 62. The output potential of the half-bridge HB is designated by U. Said output potential U is substantially identical to one of two potentials (DC+, DC−) of a voltage (for example of an intermediate circuit voltage) that is applied to the half-bridge HB. The positive potential DC+ is connected to the collector C of the high-side switch 61 and the negative potential DC− is connected to the emitter E of the low-side switch 62. If the load path C-E of the high-side switch 61 is in the on state and the load path C-E of the low-side switch 62 is in the off state, the output potential U is substantially identical to the positive potential DC+. Conversely, if the load path C-E of the high-side switch 61 is in the off state and the load path C-E of the low-side switch 62 is in the on state, the output potential U is substantially identical to the negative potential DC−. Consequently, by suitable driving of the gates G of the two switches 61, 62 by means of a drive unit 25, one of the two potentials DC+ or DC− can be provided in a targeted manner as output potential U of the half-bridge HB at an output of the semiconductor module 3.

The drive unit 25 contains a subunit CTRL/DRV HS for driving the high-side switch 61, and a subunit CTRL/DRV LS for driving the low-side switch 62.

The subunit CTRL/DRV HS comprises two inputs E11 and E12, between which a parasitic line inductance LS2 is connected, through which a load current of the high-side switch 61 (i.e. a current through the load path C-E thereof) flows. The edge steepness of the load current can be determined therefrom by the drive circuit 25 in a manner known per se. Moreover, any of the potentials fed to the inputs E11 or E12 can be used as reference potential for driving the high-side switch 61.

Correspondingly, the subunit CTRL/DRV LS comprises two inputs E21 and E22, between which a parasitic line inductance LS1 is connected, through which a load current of the low-side switch 62 (i.e. a current through the load path C-E thereof) flows. The edge steepness of the load current can be determined therefrom by the drive circuit 25 in a manner known per se. Moreover, any of the potentials fed to the inputs E21 or E22 can be used as reference potential for driving the low-side switch 62.

The subunit CTRL/DRV HS additionally comprises an input C1. The potential at the collector C of the high-side switch 61 is fed to said input. The edge steepness of the voltage dropped across the load path of the high-side switch 61 can be determined therefrom by the drive circuit 25 in a manner known per se.

Correspondingly, the subunit CTRL/DRV LS comprises an input C2. The potential at the collector C of the low-side switch 62 is fed to said input. The edge steepness of the voltage dropped across the load path of the low-side switch 62 can be determined therefrom by the drive circuit 25 in a manner known per se.

The first printed circuit board 1 can comprise three conductor tracks 14, 15 and 16, which are illustrated in each case with the aid of thick lines in FIG. 1. The conductor track 14 to which the positive potential DC+ is connected is electrically connected to the collector of the high-side switch 61, and the conductor track 15 to which the negative potential DC− is connected is electrically connected to the emitter of the low-side switch 62. The output potential U is fed to the conductor track 16. Moreover, the conductor track 16 is connected to a phase output PH, to which a load, for example an inductive load (e.g. a motor M) can be connected.

The drive unit 25 can likewise comprise one or a plurality of temperature-sensitive components. Therefore, it is structurally separate from the power semiconductor module 3.

Figure 2A:
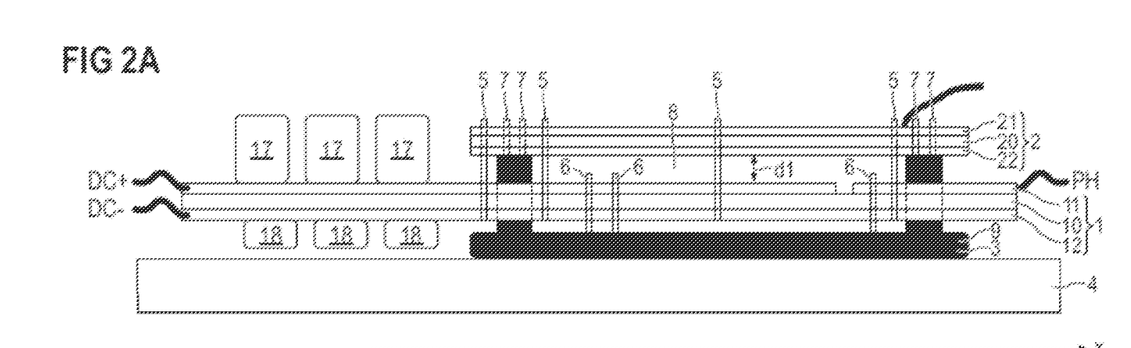
FIG. 2A shows a side view of a power semiconductor arrangement in accordance with a first exemplary embodiment.
Figure 2B:
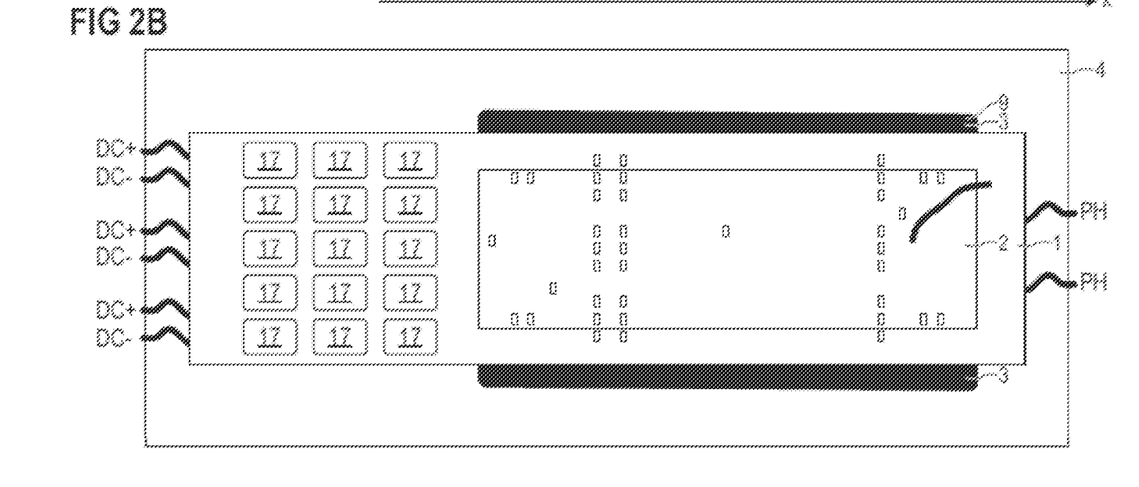
FIG. 2B shows a plan view of the power semiconductor arrangement in accordance with FIG. 2A.

FIGS. 2A and 2B schematically show a first exemplary embodiment of a power semiconductor arrangement in side view and in plan view, respectively. The arrangement contains a first printed circuit board 1, a second printed circuit board 2, a power semiconductor module 3 and an optional heat sink 4, which is thermally coupled to the power semiconductor module 3 and is fixed thereto. The power semiconductor module 3 contains a half-bridge HB such as was explained above with reference to FIG. 1.

The first printed circuit board 1 comprises, merely by way of example, a first metallization layer 11 and a second metallization layer 12, and also an insulation carrier 10 arranged therebetween. The first metallization layer 11 and/or the second metallization layer 12 can be structured to form conductor tracks. The conductor tracks form or contain wide, strip- or plate-like conductor structures which are routed parallel and are thus of low-inductance design. The first printed circuit board 1 can optionally be a laminated busbar arrangement in which the first and second metallization layers 11 and 12 are laminated together with the insulation carrier 10 to form a composite assembly. In principle, however, any other printed circuit boards can also be used.

Optionally, the first printed circuit board 1 can be populated with one or a plurality of temperature-sensitive components 17, 18, here capacitors. The capacitors 17, 18 are electrically connected in parallel by means of the first printed circuit board 1. The capacitors 17 and 18 are optional in each case. If both capacitors 17 and 18 are present, the capacitors 17, on the one hand, and the capacitors 18, on the other hand, are situated on mutually opposite sides of the first printed circuit board 1, in each case laterally alongside the semiconductor module 3.

The second printed circuit board 2 is part of a drive circuit 25 explained in FIG. 1. The population of the second printed circuit board 2 is not illustrated in FIG. 2A, for the sake of simplification. The second printed circuit board 2 comprises, merely by way of example, a first metallization layer 21 and a second metallization layer 22, and also an insulation carrier 20 arranged therebetween. The first metallization layer 21 and/or the second metallization layer 22 can be structured to form conductor tracks. The conductor tracks 14, 15 and 16 explained with reference to FIG. 1 can be embodied in the first and/or the second metallization layer 21, 22.

The first printed circuit board 1 and the second printed circuit board 2 run parallel to one another. They are at a distance d1>0. The distance d1 can be for example at least 1 mm and/or at most 50 mm. The distance d1 brings about a thermal decoupling between the first printed circuit board 1 and the second printed circuit board 2. Moreover, with the aid of the distance d1 or the free space situated between the printed circuit boards 1 and 2, a forced cooling can be effected, for example by a cooling air flow.

Furthermore, the first printed circuit board 1 is arranged between the power semiconductor module 3 and the second printed circuit board 2. The fact that the first printed circuit board 1, the second printed circuit board 2 and the power semiconductor module 3 are arranged one above another opens up the possibility of arranging electrical connections between the assemblies 1, 2 and 3 particularly flexibly with regard to their position.

One or a plurality of pins 5 are used for electrical connection between the first printed circuit board 1 and the second printed circuit board 2. One, a plurality or each of the pins 5 can either not be electrically connected to the semiconductor module 3, or can be electrically connected to the semiconductor module 3 only indirectly via the first printed circuit board 1 and/or via the second printed circuit board 2.

The power semiconductor module arrangement can furthermore comprise one or a plurality of terminals 6 of a first type, at which the semiconductor module 3 is electrically connected to the first printed circuit board 1. One, a plurality or each of the terminals 6 of the first type can either not be electrically connected to the second printed circuit board 2, or can be electrically connected thereto only indirectly via the first printed circuit board 1 and/or via the semiconductor module 3.

Moreover, the power semiconductor module arrangement can comprise one or a plurality of terminals 7 of a second type, at which the semiconductor module 3 is electrically connected to the second printed circuit board 2. One, a plurality or each of the terminals 7 of the second type can either not be electrically connected to the first printed circuit board 1, or can be electrically connected thereto only indirectly via the second printed circuit board 2 and/or via the semiconductor module 3.

Figure 3A:
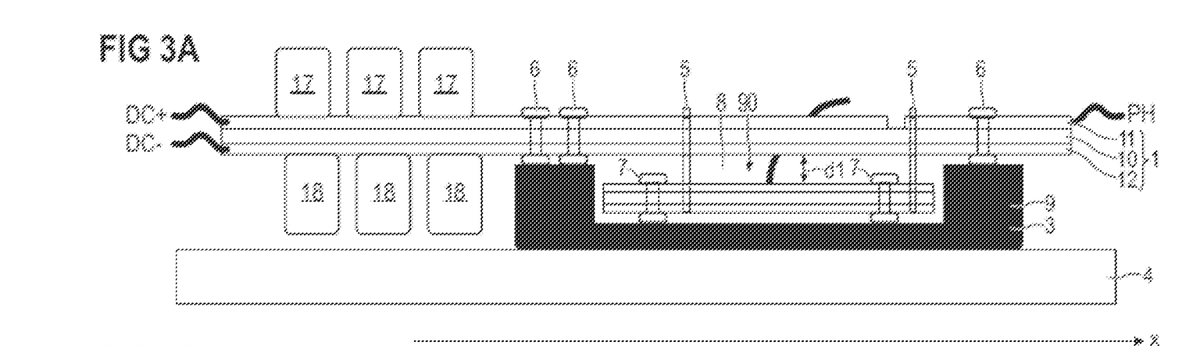
FIG. 3A shows a side view of a power semiconductor arrangement in accordance with a second exemplary embodiment.
Figure 3B:
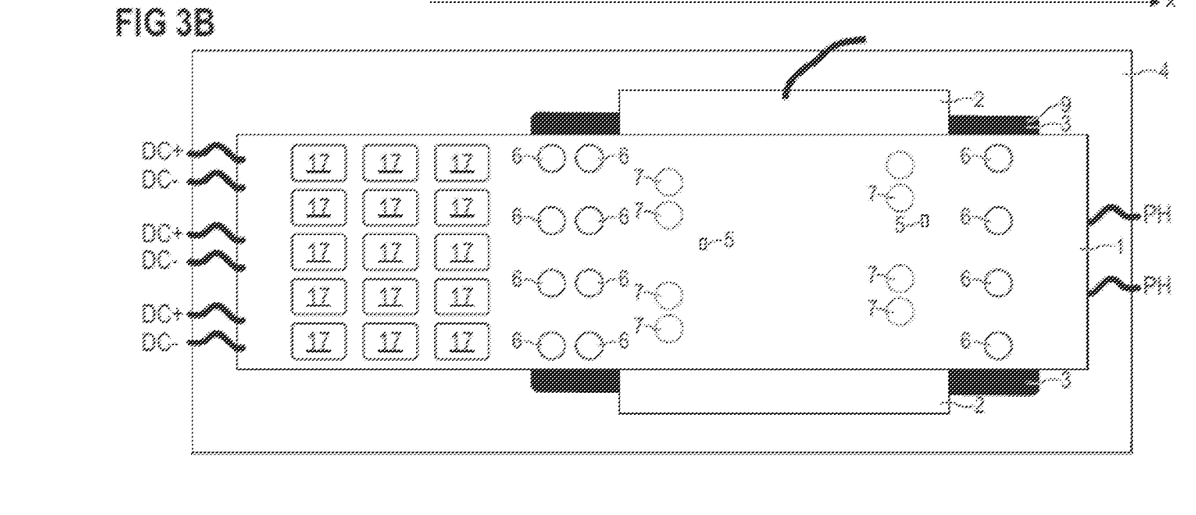
FIG. 3B shows a plan view of the power semiconductor arrangement in accordance with FIG. 3A.

FIGS. 3A and 3B schematically show a second exemplary embodiment of a power semiconductor arrangement in side view and in plan view, respectively. The arrangement contains a first printed circuit board 1, a second printed circuit board 2, a power semiconductor module 3 and an optional heat sink 4, which is thermally coupled to the power semiconductor module 3 and is fixed thereto. Moreover, the power semiconductor module 3 contains a half-bridge HB such as was explained above with reference to FIG. 1.

The first printed circuit board 1 comprises, merely by way of example, a first metallization layer 11 and a second metallization layer 12, and also an insulation carrier 10 arranged therebetween. The first metallization layer 11 and/or the second metallization layer 12 can be structured to form conductor tracks. The conductor tracks 14, 15 and 16 of the first printed circuit board 1 explained in FIG. 1 can be embodied in the first and/or the second metallization layer 11 and 12 thereof.

Optionally, the first printed circuit board 1 can be populated with one or a plurality of temperature-sensitive components 17, 18, here capacitors. The capacitors 17, 18 are electrically connected in parallel by means of the first printed circuit board 1. The capacitors 17 and 18 are optional in each case. If both capacitors 17 and 18 are present, the capacitors 17, on the one hand, and the capacitors 18, on the other hand, are situated on mutually opposite sides of the first printed circuit board 1, in each case laterally alongside the semiconductor module 3.

The second printed circuit board 2 is part of a drive circuit 25 explained in FIG. 1. The population of the second printed circuit board 2 is not illustrated in FIG. 3A, for the sake of simplification. The second printed circuit board 2 comprises, merely by way of example, a first metallization layer 21 and a second metallization layer 22, and also an insulation carrier 20 arranged therebetween. The first metallization layer 21 and/or the second metallization layer 22 can be structured to form conductor tracks.

The first printed circuit board 1 and the second printed circuit board 2 run parallel to one another. They are at a distance d1>0. The distance d1 can be for example at least 1 mm and/or at most 50 mm. The distance d1 brings about a thermal decoupling between the first printed circuit board 1 and the second printed circuit board 2.

Furthermore, the second printed circuit board 2 is arranged between the power semiconductor module 3 and the first printed circuit board 1. The fact that the first printed circuit board 1, the second printed circuit board 2 and the power semiconductor module 3 are arranged one above another opens up the possibility of arranging electrical connections between the assemblies 1, 2 and 3 particularly flexibly with regard to their position.

One or a plurality of pins 5 are once again used for electrical connection between the first printed circuit board 1 and the second printed circuit board 2. One, a plurality or each of the pins 5 can either not be electrically connected to the semiconductor module 3, or can be electrically connected to the semiconductor module 3 only indirectly via the first printed circuit board 1 and/or via the second printed circuit board 2.

The power semiconductor module arrangement can furthermore comprise one or a plurality of terminals 6 of a first type, at which the semiconductor module 3 is electrically connected to the first printed circuit board 1. One, a plurality or each of the terminals 6 of the first type can either not be electrically connected to the second printed circuit board 2, or can be electrically connected thereto only indirectly via the first printed circuit board 1 and/or via the semiconductor module 3.

Moreover, the power semiconductor module arrangement can comprise one or a plurality of terminals 7 of a second type, at which the semiconductor module 3 is electrically connected to the second printed circuit board 2. One, a plurality or each of the terminals 7 of the second type can either not be electrically connected to the first printed circuit board 1, or can be electrically connected thereto only indirectly via the second printed circuit board 2 and/or via the semiconductor module 3.

By virtue of the fact that the first printed circuit board 1, the second printed circuit board 2 and the semiconductor module 3 are arranged one above another such that one of the printed circuit boards 1, 2 is situated between the semiconductor module 3 and the other of the printed circuit boards 2, 1, there is, as mentioned, a high flexibility in the choice of the locations of the intervening connections 5, 6, 7. This flexibility can be used, as shown in FIG. 4, to increase the inductance (this is the leakage inductance LS2 in the case of the circuit in accordance with FIG. 1) used for determining the edge steepness of the load current, by virtue of a leakage inductance LS2+LS4 being connected between the inputs E11 and E12 instead of the leakage inductance LS2.

Figure 4:
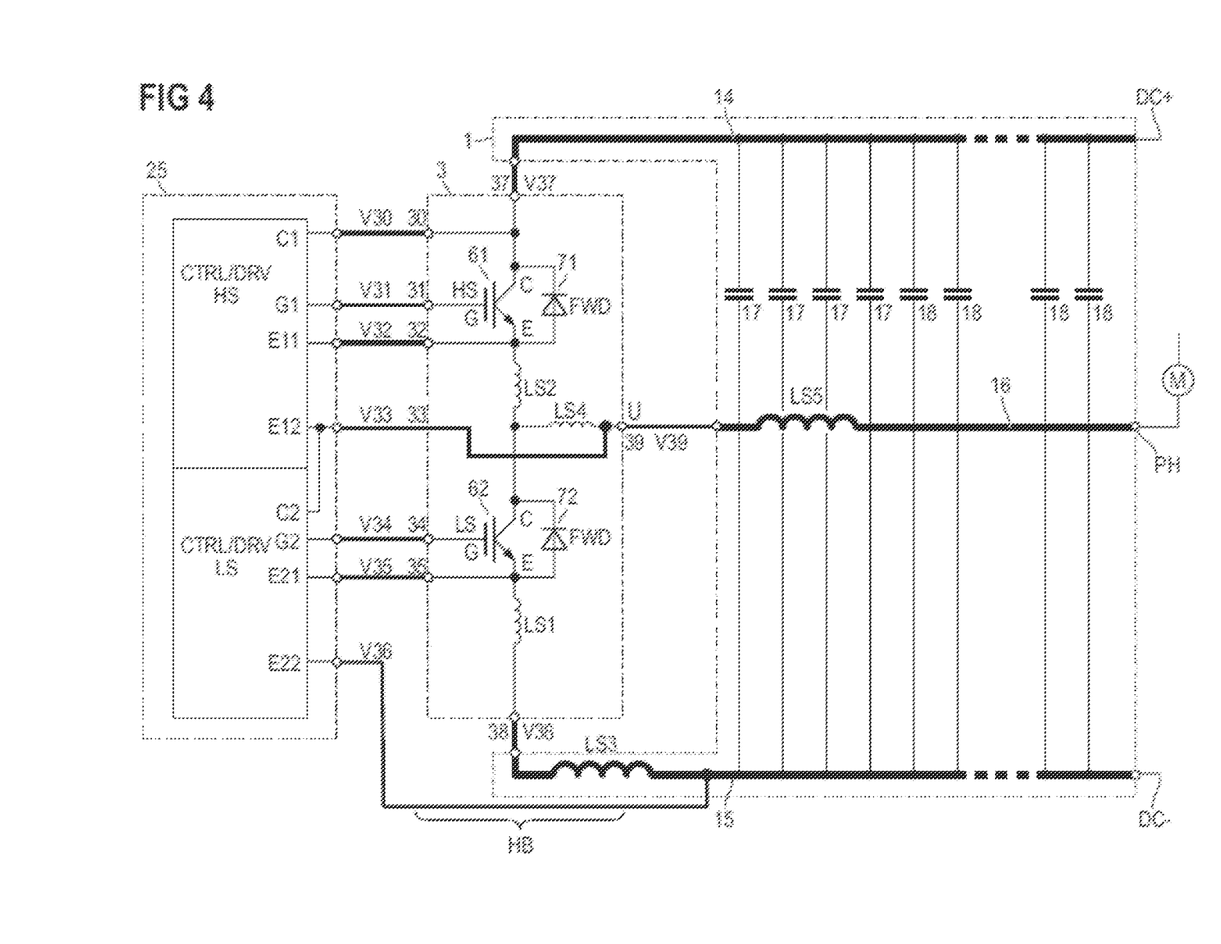
FIG. 4 shows a circuit diagram of a second configuration of a power semiconductor arrangement.

Both in the case of the circuit in accordance with FIG. 1 and in the case of the circuit in accordance with FIG. 4, the load current from the second load terminal (here: E) of the first semiconductor switch 61 to the output 39 passes via the series connection of the leakage inductances LS2 and LS4, i.e. via leakage inductances that are present anyway. In other words, the increase in inductance need not be obtained at the expense of adding an inductance to the load circuit.

Figure 5:
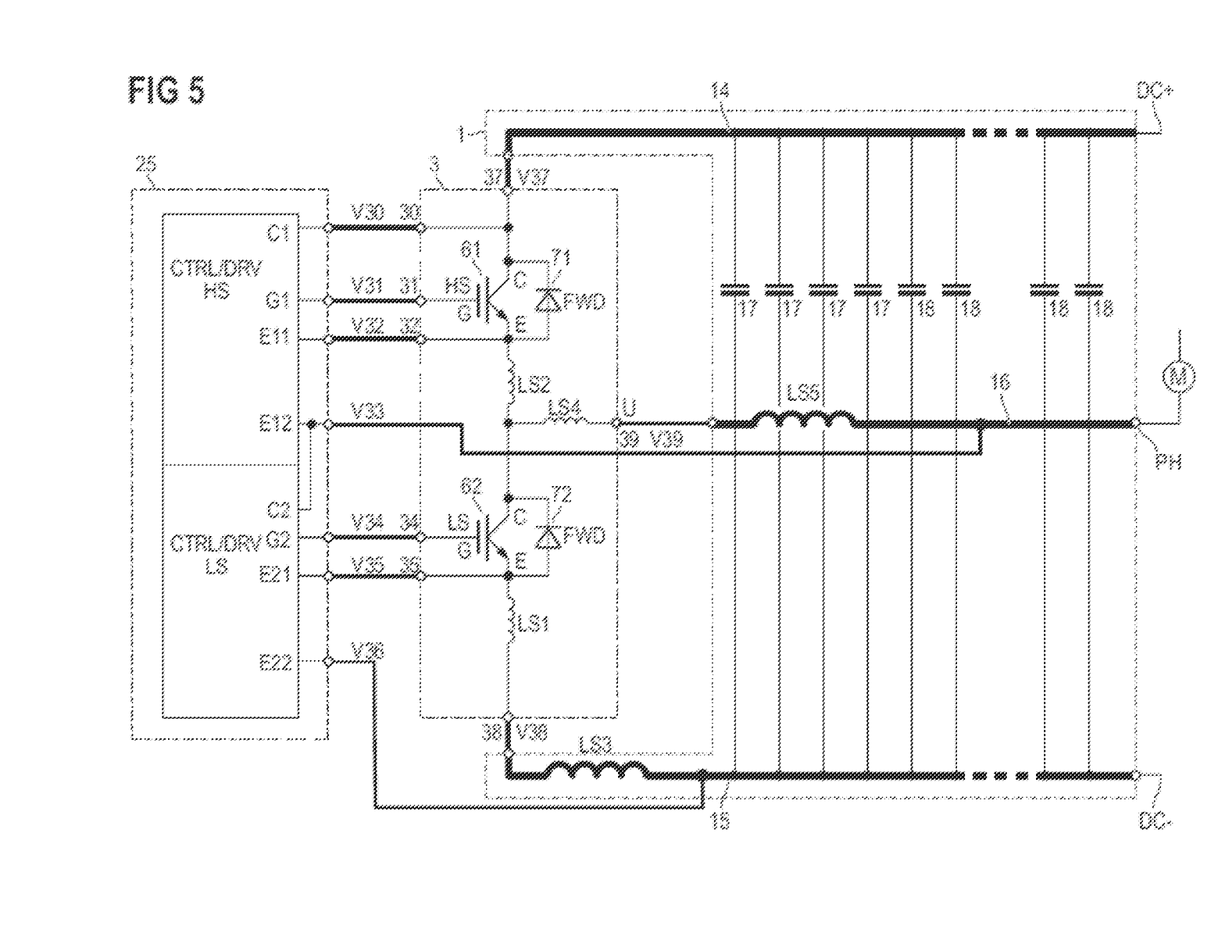
FIG. 5 shows a circuit diagram of a third configuration of a power semiconductor arrangement.

As is illustrated in FIG. 5, moreover, the leakage inductance present between the inputs E11 and E12 can be increased even further in comparison with the circuit in accordance with FIG. 4 by the tap for the potential fed to the input E12 being placed onto the line 16 of the first printed circuit board 1. As a result, between the inputs E11 and E12 there is additionally also a leakage inductance LS5 of the conductor track 16, that is to say a series connection with the leakage inductances LS2, LS4 and LS5.

As is furthermore evident from FIGS. 4 and 5, the leakage inductance (this is LS1 in FIG. 1) present between the inputs E21 and E22 can be increased in comparison with the circuit in accordance with FIG. 1 by the tap for the potential fed to the input E22 being placed onto the line 15 of the first printed circuit board 1. As a result, between the inputs E21 and E22 there is additionally also a leakage inductance LS3 of the conductor track 15, that is to say a series connection with the leakage inductances LS1 and LS3.

Electrical connections V30, V31 to V39 are illustrated in FIGS. 1, 4 and 5. The connections V30, V31, V32, V34 and V35 are connections between the first printed circuit board 1 and the semiconductor module 3, and the connections V37, V38 and V39 are connections between the second printed circuit board 2 (the latter is part of the drive circuit 25) and the semiconductor module 3.

The connection V33 in accordance with FIGS. 1 and 4 constitutes a connection between the second printed circuit board 2 and the semiconductor module 3, and the connection V33 in accordance with FIG. 5 constitutes a connection between the first printed circuit board 1 and the second printed circuit board 2. Furthermore, the connection V36 in accordance with FIG. 1 constitutes a connection between the second printed circuit board 2 and the semiconductor module 3, and the connection V36 in accordance with FIGS. 4 and 5 constitutes a connection between the first printed circuit board 1 and the second printed circuit board 2.

Any electrical connections are suitable, in principle, for producing the connections V30 to V39 or 5, 6 and 7. Pin and screw connections have already been mentioned as examples. Some examples of possible connections 5 between the first printed circuit board 1 and the second printed circuit board 2 will also be explained below (not exhaustive) with reference to FIGS. 6 to 10. In all of FIGS. 6 to 10, the connection 5 is embodied as a pin and accordingly has a straight shaft. Each pin is electrically connected to the first printed circuit board 1 at a first end and electrically connected to the second printed circuit board 2 at a second end, opposite to the first end.

Figure 6:
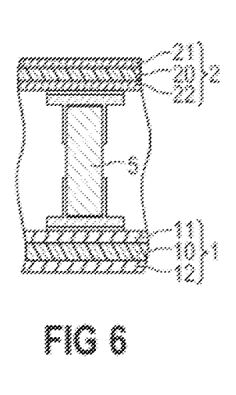
FIG. 6 shows a pin connection between the first printed circuit board and the second printed circuit board in accordance with a first example.

In the case of the arrangement in accordance with FIG. 6, a sleeve is soldered onto the metallization layer 11 of the first printed circuit board 1, the first end of the pin being plugged into said sleeve, and a second sleeve is soldered onto the metallization layer 22 of the second printed circuit board 2, the second end of the pin being plugged into said sleeve.

Figure 7:
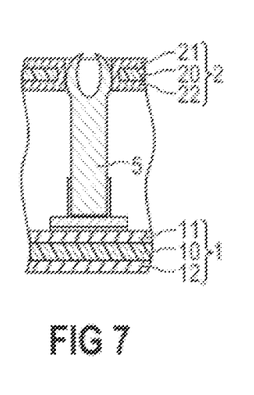
FIG. 7 shows a pin connection between the first printed circuit board and the second printed circuit board in accordance with a second example.

In the case of the arrangement in accordance with FIG. 7, a sleeve is soldered onto the metallization layer 11 of the first printed circuit board 1, the first end of the pin being plugged into said sleeve, and the second printed circuit board 2 has a plated-through hole, into which is press-fitted the second end of the pin, said second end being embodied as a press-fit end.

Figure 8:
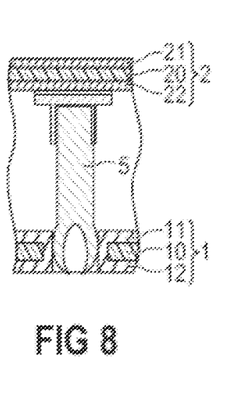
FIG. 8 shows a pin connection between the first printed circuit board and the second printed circuit board in accordance with a third example.

In the case of the arrangement in accordance with FIG. 8, a sleeve is soldered onto the metallization layer 22 of the second printed circuit board 2, the second end of the pin being plugged into said sleeve, and the first printed circuit board 1 has a plated-through hole, into which is press-fitted the first end of the pin, said first end being embodied as a press-fit end.

Figure 9:
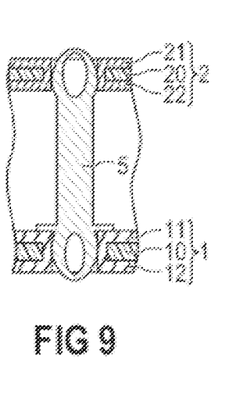
FIG. 9 shows a pin connection between the first printed circuit board and the second printed circuit board in accordance with a fourth example.

In the case of the arrangement in accordance with FIG. 9, the first and second printed circuit boards 1, 2 each have a plated-through hole. The first end of the pin is press-fitted into the plated-through hole of the first printed circuit board, and the second end of the pin is press-fitted into the plated-through hole of the second printed circuit board. Moreover, the pin also has a stop at its first end, said stop preventing the first end from being press-fitted too deeply into the plated-through hole of the first printed circuit board 1.

Figure 10:
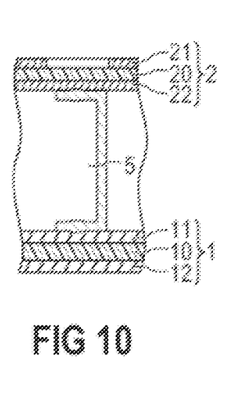
FIG. 10 shows a pin connection between the first printed circuit board and the second printed circuit board in accordance with a fifth example.

In the case of the arrangement in accordance with FIG. 10, finally, the pin is soldered or welded to the metallization layer 11 of the first printed circuit board 1 at its first end and to the metallization layer 22 of the second printed circuit board 2 at its second end.

As can furthermore be gathered from FIGS. 2A, 2B, 3A and 3B, the metallization layers 11, 12 of the first printed circuit board 1 are embodied as planar conductor areas which are parallel to one another and which are arranged at a small distance from one another. As a result, the conductor areas have a low leakage inductance. The main current flow direction within the circuit arrangement runs parallel to a longitudinal direction x of the semiconductor module 3.

As can likewise be gathered from FIGS. 2A, 2B, 3A and 3B, the connections 6 and 7 of the semiconductor module 3 to the printed circuit boards 1 and 2, respectively, can be embodied as terminals of the semiconductor module 3 which project from a housing of the semiconductor module 3 at the top side. The free ends of said terminals 6, 7, at which the electrical connections to the first and second printed circuit boards 1 and 2, respectively, are produced, can be arranged in different planes or in different planar layers. In this case, the plane or the planar layer of the free ends of the terminals 6 for making electrical contact with the first printed circuit board 1 can be situated nearer to the semiconductor module 3 or alternatively further away from the semiconductor module 3 than the plane or the planar layer of the free ends of the terminals 7 for making electrical contact with the second printed circuit board 2.

Depending on the required current-carrying capacity, the high-side switch 61 and the low-side switch 62 can optionally be formed in each case by parallel connection of two or more semiconductor chips. In this case, the semiconductor chips of the parallel connection for the high-side switch 61 can be arranged in one or a plurality of rows running in each case in a direction parallel to the first printed circuit board 1 and perpendicularly to the longitudinal direction x. If the semiconductor chips of the parallel connection for the high-side switch 61 are arranged in two or more rows, the rows are arranged one behind another in the longitudinal direction x. Correspondingly, the semiconductor chips of the parallel connection for the low-side switch 62 can be arranged in one or a plurality of rows each running in a direction parallel to the first printed circuit board 1 and perpendicular to the longitudinal direction x. If the semiconductor chips of the parallel connection for the low-side switch 62 are arranged in two or more rows, the rows are arranged one behind another in the longitudinal direction x.

A plurality of capacitors 17 and/or a plurality of capacitors 18 can form a capacitor block, which is spaced apart from the semiconductor module 3 for example parallel to the longitudinal direction x. The capacitors 17, 18 can be electrically connected in parallel with the aid of the metallization layers 11 and 12. Moreover, the capacitors 17, 18 can be arranged in one or a plurality of rows each running in a direction parallel to the first printed circuit board 1 and perpendicularly to the longitudinal direction x. If the capacitors are arranged in two or more rows, the or some of the rows can be arranged one behind another in the longitudinal direction x.

Particularly simple assembly of the power semiconductor arrangement can be realized using connections 5, 6, 7 that are embodied as press-fit contacts. In this case, the power semiconductor arrangement of the two printed circuit boards 1, 2 which is situated nearest to the semiconductor module 3 in the finished assembled power semiconductor arrangement is mounted first on the semiconductor module 3. In the example in accordance with FIGS. 2A and 2B, therefore, first the (prepopulated) first printed circuit board 1 is mounted on the semiconductor module 3, and then the (prepopulated) second printed circuit board 2 is mounted. In the example in accordance with FIGS. 3A and 3B, by contrast, firstly the (prepopulated) second printed circuit board 2 is mounted on the semiconductor module 3, and then the (prepopulated) first printed circuit board 1 is mounted.

Insofar as the semiconductor module 3 has press-fit contacts for making electrical contact with the first and second printed circuit boards 1, 2, firstly the printed circuit board mounted first on the semiconductor module 3 is pressed onto the associated press-fit contacts of the semiconductor module 3. The other printed circuit board is then pressed onto the associated press-fit contacts of the semiconductor module 3 and also onto one or a plurality of further press-fit contacts with which one printed circuit board was populated (before or after its mounting on the semiconductor module 3). The further press-fit contacts (5 in FIGS. 2A, 2B, 3A, 3B) serve for direct electrical connection between the first and second printed circuit boards 1, 2.

In accordance with one optional configuration, the semiconductor module 3 comprises control terminals/control pins which project beyond the first printed circuit board 1 and in this case extend through passage openings of the second printed circuit board 2 or are led laterally past the latter. As a result, the free ends of the control terminals/pins facing away from the housing of the semiconductor module 3 project beyond the first printed circuit board 1 on that side thereof which faces away from the semiconductor module 3.

As can be gathered from the plan views in accordance with FIGS. 2B and 3C, a plurality of terminals can be led out of the semiconductor module 3 as a strip or on the basis of a plurality of parallel pins and are connected to one of the metallization layers 11, 12 of the first printed circuit board 1 per terminal by a plurality of screws, a plurality of solder contacts, a plurality of press-fit contacts or a plurality of welding points.

A semiconductor module 3 containing one half-bridge HB was explained in the previous examples. In principle, a semiconductor module can also contain two half-bridges (e.g. H-bridge), three half-bridges HB (e.g. 3-phase converter) or more than three half-bridges HB, each of which is connected between the same potentials DC+ and DC− in the same way as the half-bridge HB explained with reference to FIGS. 1, 4 and 5. However, a semiconductor module 3 can for example also contain a multilevel circuit or a matrix converter, or else a (logical) individual switch formed from one or a plurality of semiconductor chips connected in parallel.

Optionally, a semiconductor module 3 can comprise a plurality of parallel control pins (e.g. gate pin, auxiliary emitter pin), the terminal ends of which lie in a different plane than the power terminals (i.e. the terminals via which a load current of the semiconductor module 3 flows; these are the terminals 37, 38 and 39 in FIGS. 1, 4 and 5) of the semiconductor module 3.

The pins of each pair comprising a gate pin and an associated auxiliary emitter pin (the latter constitutes the reference potential for driving the relevant gate) can be routed closely adjacently.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
   a semiconductor module having a controllable power semiconductor component comprising a first load terminal and a second load terminal between which a load path of the power semiconductor component is formed, and a control terminal for controlling the load path;
   a first printed circuit board arranged outside the semiconductor module and having a conductor track connected in series with the load path; and
   a control unit arranged outside the semiconductor module and configured to control the controllable power semiconductor component, the control unit comprising a second printed circuit board,
   wherein the first printed circuit board and the second printed circuit board are spaced apart from one another,
   wherein the first printed circuit board and the second printed circuit board are electrically connected to one another by a pin.

2. The power semiconductor module arrangement of claim 1, wherein the pin is not electrically connected to the semiconductor module or is electrically connected to the semiconductor module only indirectly via the first printed circuit board and/or via the second printed circuit board.

3. The power semiconductor module arrangement of claim 1, wherein the semiconductor module has a terminal of a first type which electrically connects the semiconductor module to the first printed circuit board.

4. The power semiconductor module arrangement of claim 3, wherein the terminal of the first type is not electrically connected to the second printed circuit board or is electrically connected to the second printed circuit board only indirectly via the first printed circuit board and/or via the semiconductor module.

5. The power semiconductor module arrangement of claim 3, wherein the terminal of the first type is a press-fit contact.

6. The power semiconductor module arrangement of claim 1, wherein the semiconductor module comprises a terminal of a second type which electrically connects the semiconductor module to the second printed circuit board.

7. The power semiconductor module arrangement of claim 6, wherein the terminal of the second type is not electrically connected to the first printed circuit board or is electrically connected to the first printed circuit board only indirectly via the second printed circuit board and/or via the semiconductor module.

8. The power semiconductor module arrangement of claim 6, wherein the terminal of the second type is a press-fit contact.

9. The power semiconductor module arrangement of claim 1, wherein the first printed circuit board is arranged between the semiconductor module and the second printed circuit board.

10. The power semiconductor module arrangement of claim 1, wherein the second printed circuit board is arranged between the semiconductor module and the first printed circuit board.

11. The power semiconductor module arrangement of claim 10, wherein the semiconductor module comprises a housing having a depression, and wherein the first printed circuit board extends across the depression and/or the second printed circuit board is arranged in the depression.

12. The power semiconductor module arrangement of claim 1, wherein the first printed circuit board is populated with a capacitor or with a plurality of capacitors which are electrically connected in parallel by conductor tracks of the first printed circuit board.

13. The power semiconductor module arrangement of claim 1, wherein the first printed circuit board and the second printed circuit board are arranged parallel to one another.

14. The power semiconductor module arrangement of claim 1, wherein the control unit comprises a first input and a second input, wherein a section of a conductor track of the first printed circuit board is electrically connected between the first input and the second input.

15. The power semiconductor module arrangement of claim 14, wherein a series connection, in which the section of the conductor track is connected in series with an electrical connection between the first printed circuit board and the second printed circuit board, is electrically connected between the first input and the second input.

16. The power semiconductor module arrangement of claim 15, wherein the electrical connection is a plug and/or press-fit connection.

17. The power semiconductor module arrangement of claim 1, wherein the semiconductor module comprises:
- a plurality of first terminal pins which project from a module housing at a top side and which each have a first contact end in electrical contact with the first printed circuit board; and
- a plurality of second terminal pins which project from the module housing at the top side and which each have a second contact end in electrical contact with the second printed circuit board;
- wherein the first contact ends and the second contact ends extend away from the top side and the module housing in one direction such that the second contact ends project beyond the first contact ends.

* * * * *